United States Patent
Hadrick

(10) Patent No.: US 10,832,759 B2
(45) Date of Patent: *Nov. 10, 2020

(54) HALF-WIDTH, DOUBLE PUMPED DATA PATH

(71) Applicant: Micron Technology, Inc., Boise, ID (US)

(72) Inventor: Mark K. Hadrick, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/526,681

(22) Filed: Jul. 30, 2019

(65) Prior Publication Data

US 2019/0355410 A1   Nov. 21, 2019

Related U.S. Application Data

(63) Continuation of application No. 15/974,120, filed on May 8, 2018, now Pat. No. 10,388,362.

(51) Int. Cl.
| | |
|---|---|
| *G11C 11/4096* | (2006.01) |
| *G11C 11/4093* | (2006.01) |
| *G11C 11/4076* | (2006.01) |
| *G11C 11/408* | (2006.01) |
| *G11C 29/42* | (2006.01) |

(52) U.S. Cl.
CPC ...... *G11C 11/4093* (2013.01); *G11C 11/4076* (2013.01); *G11C 11/4082* (2013.01); *G11C 11/4096* (2013.01); *G11C 29/42* (2013.01)

(58) Field of Classification Search
CPC ............................. G11C 11/4093; G11C 7/222

USPC .................................................. 365/149, 193
See application file for complete search history.

(56) References Cited

U.S. PATENT DOCUMENTS

| | | | | |
|---|---|---|---|---|
| 4,309,754 A | * | 1/1982 | Dinwiddie, Jr. | ..... G06F 13/4018 710/307 |
| 5,297,242 A | * | 3/1994 | Miki | ..................... G06F 13/287 710/22 |
| 5,404,338 A | | 4/1995 | Murai et al. | |
| 5,828,884 A | * | 10/1998 | Lee | ......................... G06F 7/768 717/141 |
| 5,867,446 A | | 2/1999 | Konishi et al. | |

(Continued)

FOREIGN PATENT DOCUMENTS

| | | |
|---|---|---|
| JP | 5268392 B2 | 8/2013 |
| TW | 201103022 A | 1/2011 |

OTHER PUBLICATIONS

PCT International Search Report & Written Opinion for PCT Application No. PCT/US2019/016974 dated May 21, 2019; 9 Pages.

(Continued)

*Primary Examiner* — Michael T Tran
(74) *Attorney, Agent, or Firm* — Fletcher Yoder, P.C.

(57) ABSTRACT

Memory devices with half-width data path or data buses clocked by double-pumped strobe signals are disclosed herein. The methods and devices may employ a single delay chain (e.g., a column access strobe (CAS) chain) to perform the double-pumped operations. The delay chain may include multiple delay elements that may generate one or two pulses based on the double-pumped strobe signals. Methods for interfacing, such as read and write methods are also disclosed.

17 Claims, 8 Drawing Sheets

(56) References Cited

U.S. PATENT DOCUMENTS

| | | | |
|---|---|---|---|
| 5,909,701 A * | 6/1999 | Jeddeloh | G06F 13/1689 365/193 |
| 5,943,280 A | 8/1999 | Tsukamoto et al. | |
| 6,161,153 A * | 12/2000 | Porterfield | G06F 13/404 710/310 |
| 6,292,428 B1 | 9/2001 | Tomita et al. | |
| 6,370,630 B1 * | 4/2002 | Mizuyabu | G06F 13/4243 711/167 |
| 6,434,654 B1 * | 8/2002 | Story | G06F 13/385 709/235 |
| 6,466,491 B2 * | 10/2002 | Yanagawa | G06F 13/1689 365/193 |
| 6,667,993 B1 | 12/2003 | Lippett et al. | |
| 6,801,468 B1 | 10/2004 | Lee | |
| 6,996,027 B2 | 2/2006 | Shin | |
| 7,117,281 B1 * | 10/2006 | Hashimoto | G06F 13/28 710/107 |
| 7,171,496 B2 * | 1/2007 | Tanaka | G06F 13/4018 710/66 |
| 7,176,714 B1 * | 2/2007 | Lee | H03K 19/17744 326/38 |
| 7,319,418 B2 * | 1/2008 | Fink | G08C 15/00 324/718 |
| 7,414,916 B1 * | 8/2008 | Yu | G11C 7/1051 365/189.02 |
| 7,542,324 B1 * | 6/2009 | Choe | G11C 5/063 365/198 |
| 7,855,931 B2 * | 12/2010 | LaBerge | G11C 5/02 365/230.03 |
| 8,006,066 B2 * | 8/2011 | Becker | H03M 13/4169 700/24 |
| 8,020,068 B2 * | 9/2011 | Lee | G06F 11/1008 714/752 |
| 8,289,760 B2 * | 10/2012 | Jeddeloh | G11C 5/02 365/163 |
| 8,447,908 B2 * | 5/2013 | Bruce | G06F 12/00 710/308 |
| 8,732,377 B2 * | 5/2014 | Sakaguchi | G06F 13/4059 710/117 |
| 9,166,596 B2 | 10/2015 | Chong et al. | |
| 9,530,472 B1 | 12/2016 | Park et al. | |
| 9,640,236 B2 * | 5/2017 | Sun | G11C 5/04 |
| 9,997,233 B1 | 6/2018 | Ware et al. | |
| 2001/0028576 A1 * | 10/2001 | Miwa | G11C 16/10 365/185.03 |
| 2001/0046163 A1 * | 11/2001 | Yanagawa | G06F 13/1689 365/194 |
| 2002/0015328 A1 * | 2/2002 | Dono | G11C 14/00 365/185.08 |
| 2003/0002357 A1 | 1/2003 | Kwon et al. | |
| 2003/0009642 A1 * | 1/2003 | Takeshita | G11C 7/1045 711/154 |
| 2003/0145149 A1 * | 7/2003 | Nagano | G06F 13/1694 710/307 |
| 2004/0143701 A1 * | 7/2004 | Giambalvo | G11C 15/00 711/108 |
| 2004/0196719 A1 | 10/2004 | Aritomi et al. | |
| 2004/0235265 A1 * | 11/2004 | Neaves | H04L 25/10 438/438 |
| 2006/0126406 A1 | 6/2006 | Lin et al. | |
| 2006/0259569 A1 * | 11/2006 | Jagathesan | G06F 13/385 709/213 |
| 2007/0127296 A1 | 6/2007 | Cha | |
| 2008/0201496 A1 * | 8/2008 | Gillingham | G11C 7/22 710/23 |
| 2008/0239842 A1 | 10/2008 | Cha et al. | |
| 2009/0031117 A1 * | 1/2009 | Farooqui | G06F 9/30014 712/220 |
| 2009/0059692 A1 | 3/2009 | Park | |
| 2009/0086557 A1 | 4/2009 | Lee | |
| 2009/0108932 A1 * | 4/2009 | Morishima | H03F 3/217 330/251 |
| 2009/0168566 A1 | 7/2009 | Chung et al. | |
| 2009/0303808 A1 | 12/2009 | Park | |
| 2009/0316502 A1 | 12/2009 | Lee | |
| 2010/0034045 A1 * | 2/2010 | Sato | G11C 7/1006 365/236 |
| 2010/0268901 A1 | 10/2010 | Shaeffer | |
| 2011/0035644 A1 * | 2/2011 | Madan | G06F 11/1048 714/758 |
| 2011/0069546 A1 | 3/2011 | Watanabe | |
| 2011/0249520 A1 | 10/2011 | Kim | |
| 2013/0232372 A1 | 9/2013 | Sakamaki et al. | |
| 2014/0082282 A1 * | 3/2014 | Wang | G11C 7/1006 711/114 |
| 2014/0164734 A1 * | 6/2014 | Muff | G06F 9/3891 712/16 |
| 2014/0281680 A1 * | 9/2014 | Nemazie | G06F 11/1008 714/6.1 |
| 2014/0325105 A1 * | 10/2014 | Prete | G06F 13/1642 710/112 |
| 2014/0344515 A1 * | 11/2014 | Wang | G06F 12/02 711/110 |
| 2016/0232829 A1 * | 8/2016 | Ahn | G09G 3/2003 |
| 2017/0060789 A1 | 3/2017 | Noda | |
| 2017/0085475 A1 * | 3/2017 | Cheng | H04L 12/42 |
| 2017/0147429 A1 * | 5/2017 | Motwani | G06F 11/1012 |
| 2017/0371812 A1 * | 12/2017 | Chun | G06F 3/0613 |
| 2018/0113826 A1 * | 4/2018 | Li | G06F 3/0622 |
| 2018/0157435 A1 * | 6/2018 | Chang | G06F 3/0673 |
| 2018/0314830 A1 * | 11/2018 | Strunkmann | G06F 21/51 |
| 2019/0042500 A1 * | 2/2019 | Agarwal | G06F 13/28 |
| 2019/0065416 A1 * | 2/2019 | Schaefer | G06F 1/3275 |
| 2019/0095361 A1 * | 3/2019 | Morris | G06F 13/1663 |
| 2019/0198096 A1 * | 6/2019 | Mirichigni | G11C 13/0004 |
| 2019/0295675 A1 * | 9/2019 | Lee | G11C 29/10 |

OTHER PUBLICATIONS

Taiwan Office Action for TW Application No. 108105527 dated Jan. 13, 2020, pp. 32.

* cited by examiner

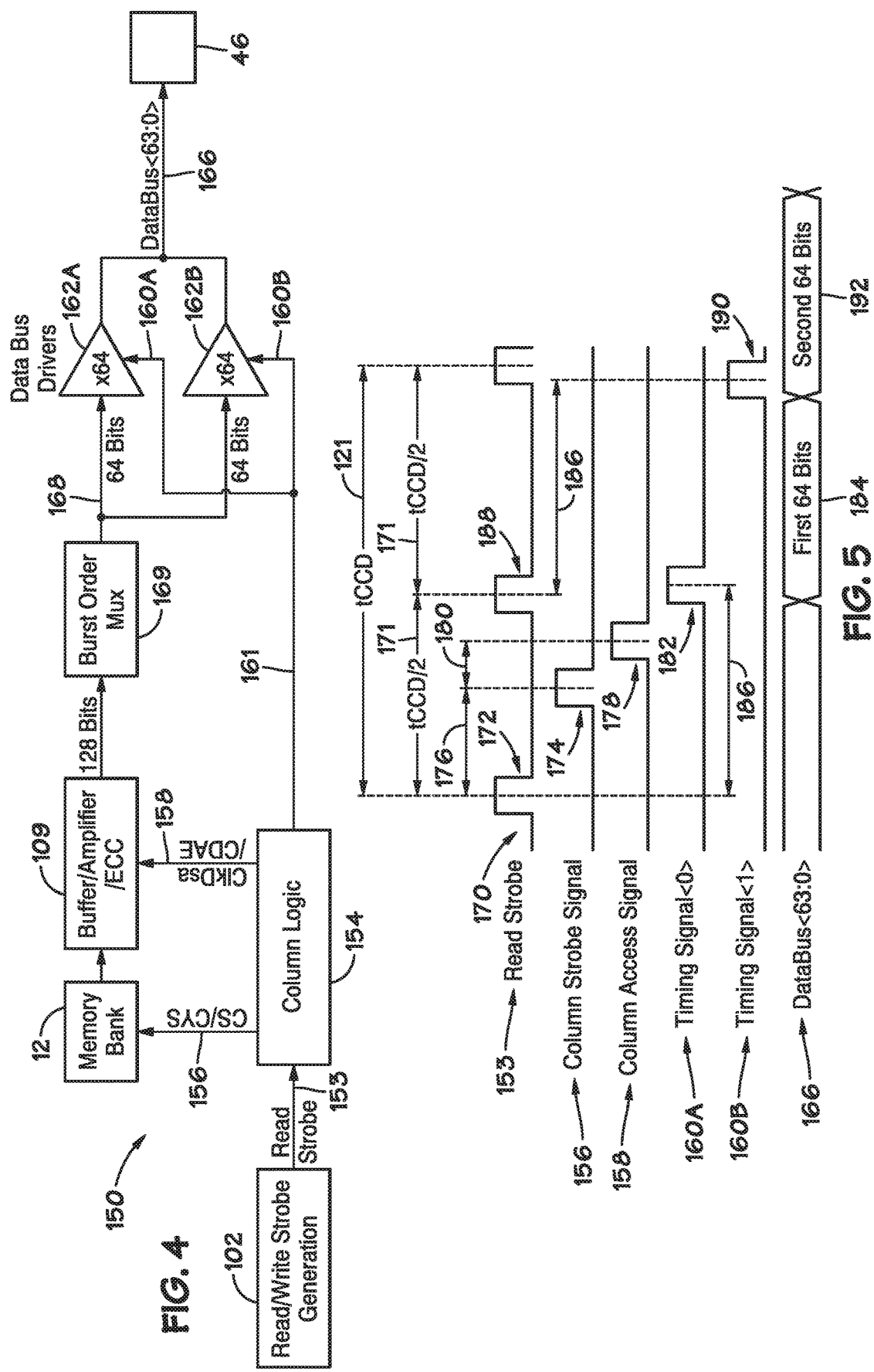

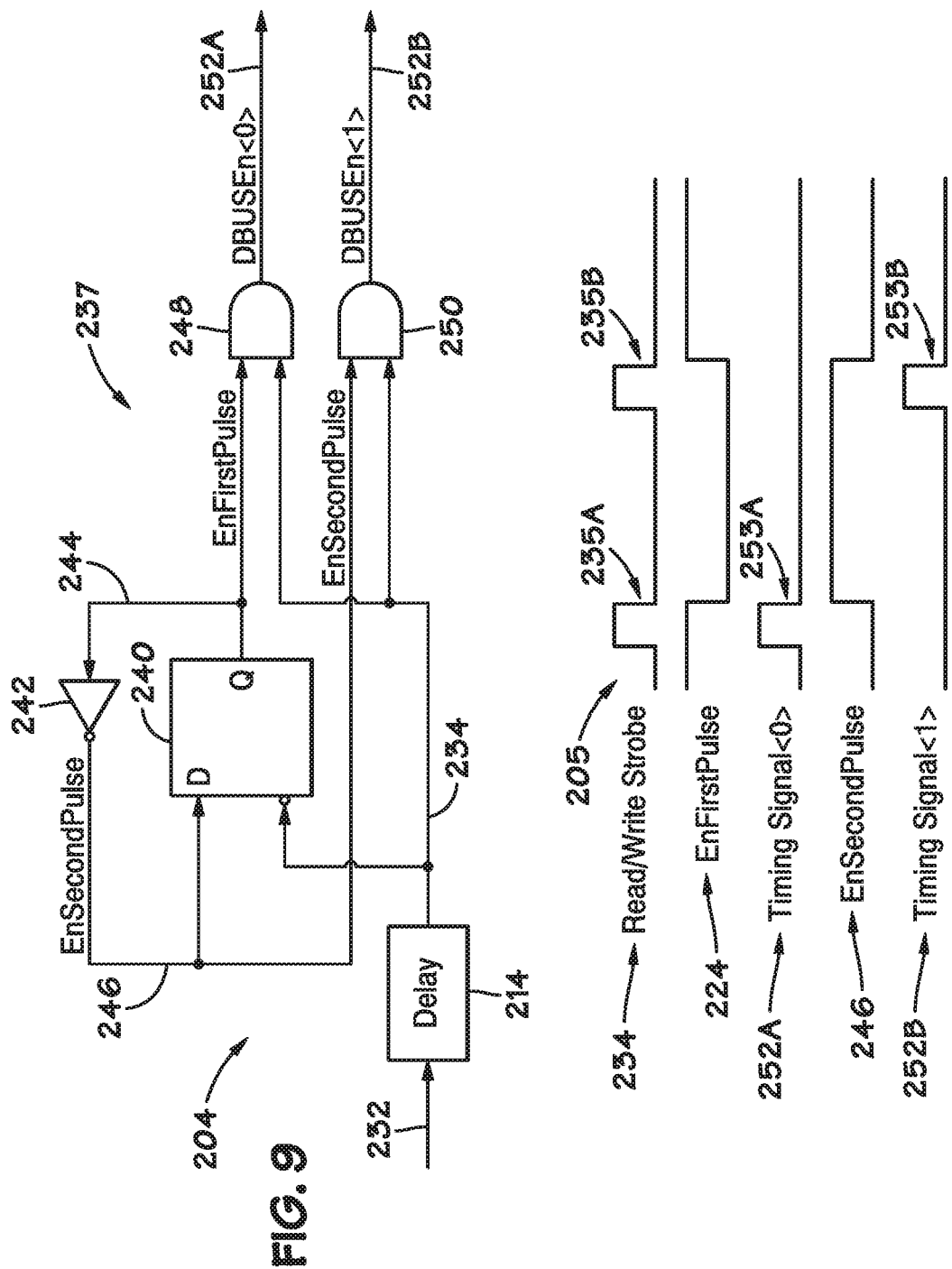

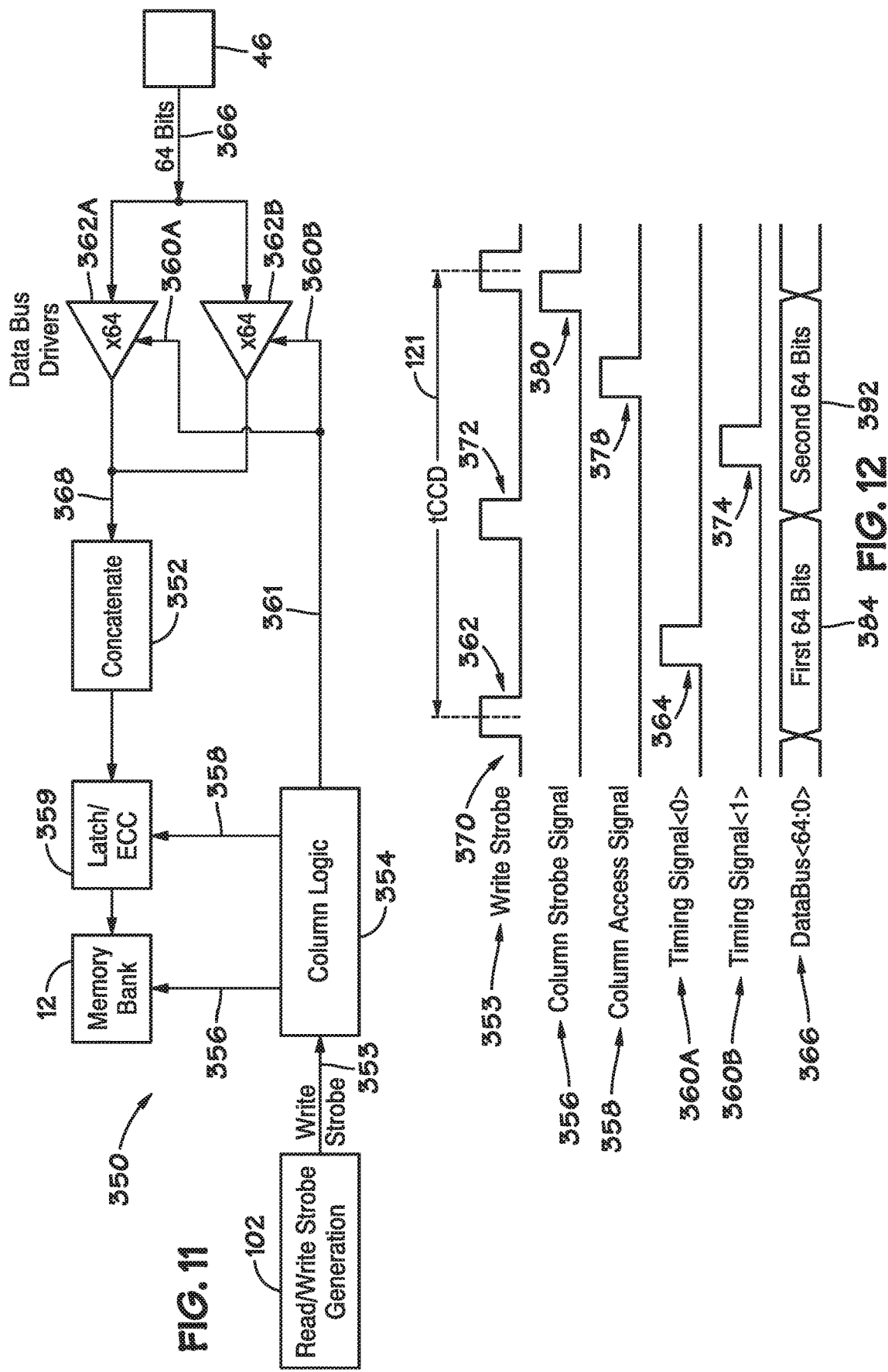

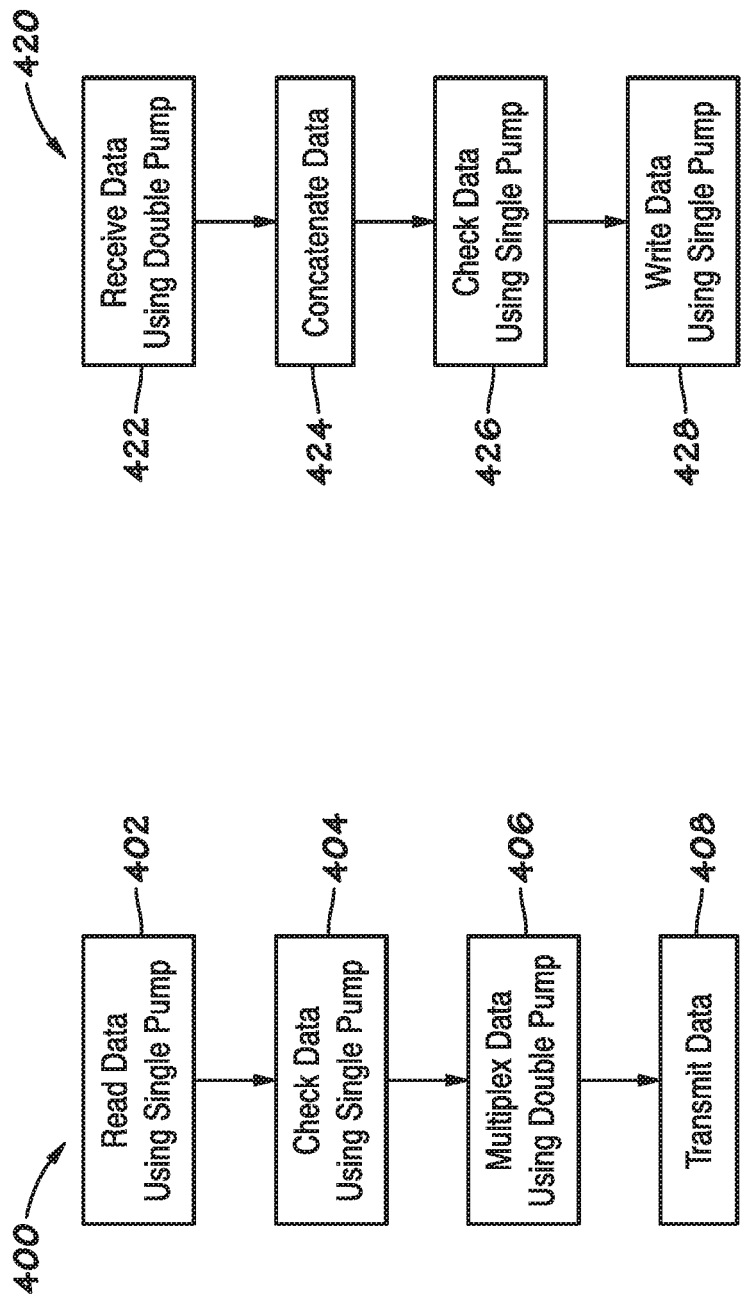

HALF-WIDTH, DOUBLE PUMPED DATA PATH

CROSS REFERENCE TO RELATED APPLICATIONS

This application is a Continuation and claims priority to U.S. patent application Ser. No. 15/974,120 filed May 8, 2018, which is herein incorporated by reference.

BACKGROUND

1. Field of the Present Disclosure

This disclosure relates to a data transfer bus and data transfer bus control, and more particularly, to methods and systems capable of using a half-width data path with double pump clock strategies.

2. Description of Related Art

Memory devices, such as random access memory (RAM) devices, dynamic RAM devices (DRAMs), static RAM devices (SRAMs), or flash memories, are often used in electronic systems to provide memory functionality to facilitate data processing operations and/or facilitate data storage that may facilitate data processing operations. To that end, these memory devices may have addressable memory elements (e.g., cells, rows, columns, etc.) arranged in memory banks. The memory devices may provide data access to memory elements for processing circuitry (e.g., a processor, a microcontroller, a system-on-chip) through an input/output (I/O) interface. The I/O interface of the memory device may be coupled to the memory elements through an internal data path.

In many systems, the width of the data path (e.g., the number of parallel bits transported) may be similar to the memory word size. For example, 128-bit memory devices (e.g., memory devices with 128-bit words) may have a 128-bit wide data path coupling the memory banks to the I/O interface. Such a wide data path and bus may require substantial chip space in the memory device and lead to metal congestion from the amount of data lines. As the bandwidth and word size increases with technology, conventional data path solutions may become substantially constrained by the chip space and power consumption requirements.

BRIEF DESCRIPTION OF THE DRAWINGS

Various aspects of this disclosure may be better understood upon reading the following detailed description and upon reference to the drawings in which:

FIG. 4 is a block diagram illustrating memory bank access circuitry that may perform read operations using a half-width, double pumped data path, in accordance with an embodiment;

FIG. 5 is a timing diagram illustrating a read operation that may be performed by memory bank access circuitry, such as that of FIG. 4, in accordance with an embodiment;

FIG. 9 is a block diagram illustrating a dual pulse generator block that may be used in column access logic, such as that of FIG. 6, in accordance with an embodiment;

FIG. 10 is a timing diagram illustrating the pulse generation of the dual pulse generator block of FIG. 9, in accordance with an embodiment;

FIG. 11 is a block diagram illustrating memory bank access circuitry that may perform write operations using a half-width, double pumped data path, in accordance with an embodiment;

FIG. 12 is a timing diagram illustrating a write operation that may be performed by memory bank access circuitry, such as that of FIG. 11, in accordance with an embodiment;

FIG. 14 is a method to read data from a memory device employing a half-width double pumped data path, in accordance with an embodiment; and FIG. 15 is a method to write data to a memory device employing a half-width double pumped data path, in accordance with an embodiment.

DETAILED DESCRIPTION

Figure 1:
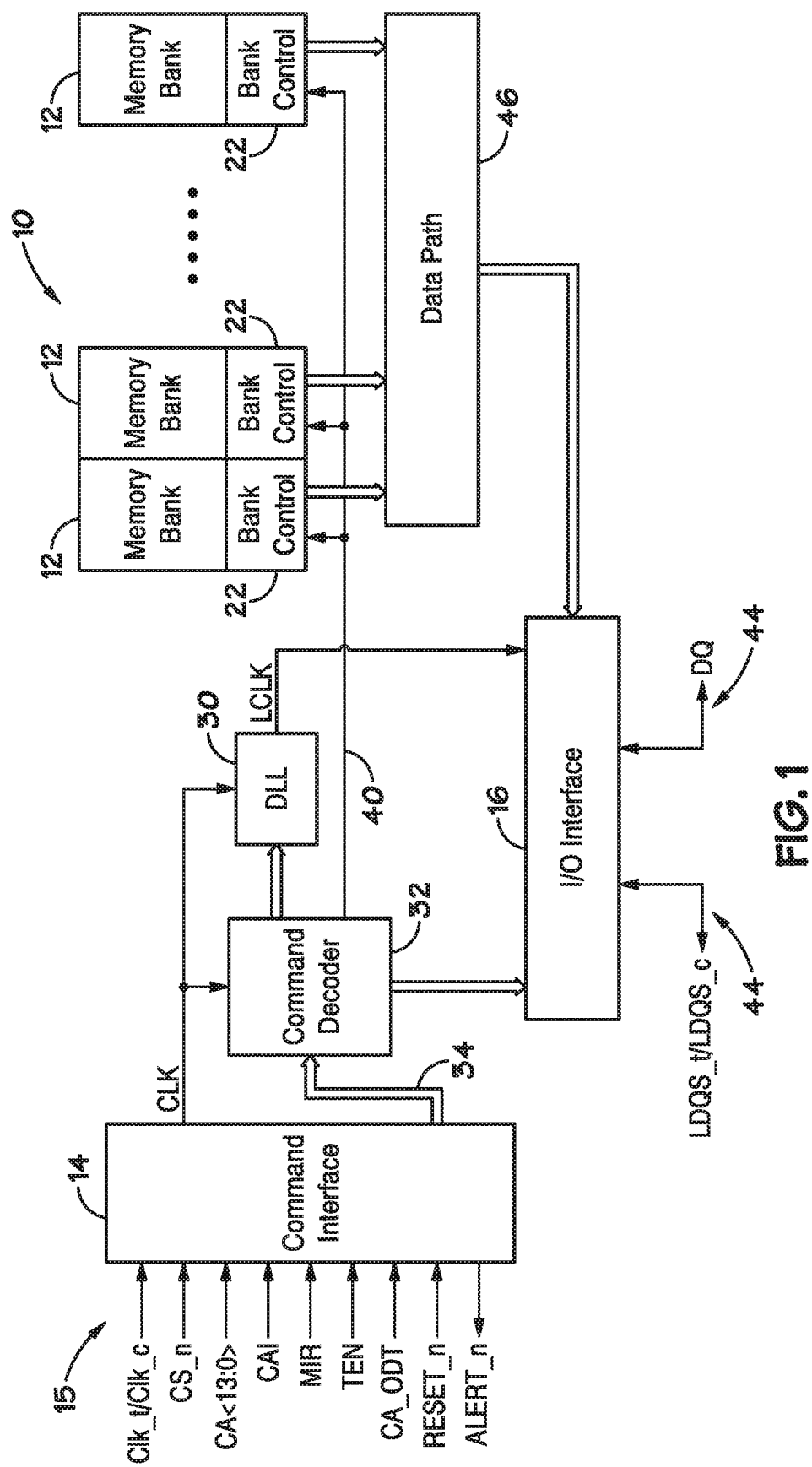
FIG. 1 is a block diagram illustrating an organization of a memory device that may implement the half-width, double pumped data path, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Many electronic systems may employ memory devices to provide data storage functionalities and/or facilitate the performance of data processing operations. Several memory devices may perform storage using addressable memory elements (e.g., memory cells), which may be disposed in memory banks. Examples of memory devices include random access memories (RAMs) devices, dynamic RAM (DRAMs) devices, static RAM (SRAMs) devices, and/or flash memory devices, among others. Processing circuitry in the electronic systems may access (e.g., read/write) the memory elements by interacting with an input/output (I/O) interface and a command interface. As an example, a processor may read stored information from a particular data element from the memory device by providing a read command and/or an address via the command interface, and retrieve the requested information via the I/O interface.

A memory device may be designed to support a specified word length. For example, a memory device may be programmed to read stored words or write incoming words having a particular data width (e.g., 128 bits, 64 bits, etc.) in the performed operations. Accordingly, the data path that internally couples the I/O interface to the memory banks of the memory device during read and write operations may be designed based on the word length. In conventional systems, the data path may include a data bus with a width that is the same as the word length. However, as the word length increases and the data rate increases, such design choices may lead to a data path with a large number of data lines, which may lead to substantial metallization in the device layout and large power consumption in the data bus.

The embodiments discussed herein relate to systems and methods for using half-width data paths for coupling the I/O interface to the memory banks that are triggered by a double pump clocking (e.g., strobing) strategy. To that end, the memory devices may include a double pump clock delay chain (e.g., column access logic, column access strobe (CAS) chain), that includes delay elements capable of producing single activating pulses (e.g., column timing signals) or double activating pulses (e.g., data timing signals), as detailed below. As a result, a single column logic may clock stages of the data transmission line that employ the full-width bandwidth and process full length words, such as the column access stages, as well as the stages that operate with half-width bandwidth and process short words, such as the data path drivers and buffers. The clock delay chains described herein, thus, allow double pump clocking that operates without substantial duplication of circuitry in the data path, the memory bank controllers, and/or in the I/O interface. Moreover, the methods and system discussed herein allow half-width data paths without the need to generate a replica of the delay chain that is offset by half-period.

Turning now to the figures, FIG. 1 is a simplified block diagram illustrating certain features of a memory device 10. Specifically, the block diagram of FIG. 1 is a functional block diagram illustrating a DRAM memory device 10 that employs a half-width double pumped data path. In accordance with one embodiment, the memory device 10 may be a double data rate type five synchronous dynamic random access memory (DDR5 SDRAM) device. Various features of DDR5 SDRAM allow for reduced power consumption, more bandwidth, and more storage capacity compared to prior generations of DDR SDRAM. The memory device 10 may include a number of memory banks 12. The memory banks 12 may be DDR5 SDRAM memory banks, for instance. The memory banks 12 may be programmed to operate (e.g., read and/or write) with words of specified lengths. For example, DDR5 SDRAM memory banks may be programmed to employ 128-bit words.

The memory banks 12 may be provided on one or more chips (e.g., SDRAM chips) that are arranged on dual inline memory modules (DIMMs). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 4 bank groups, each bank group including 4 memory banks. For a 16 Gb DDR5 SDRAM, the memory chip may include 32 memory banks 12, arranged into 8 bank groups, each bank group including 4 memory banks, for instance. Various other configurations, organization, and sizes of the memory banks 12 on the memory device 10 may be utilized depending on the application and design of the overall system.

The memory device 10 may include a command interface 14 and an input/output (I/O) interface 16. The command interface 14 is configured to receive a number of signals (e.g., signals 15) from processing circuitry coupled to the devices, such as a processor or controller. The processor or controller may provide various signals 15 to the memory device 10 to facilitate the transmission and receipt of data to be written to or read from the memory device 10. As an example of signals 15, the processor or controller may request a read and/or write operation by providing the corresponding command and address via the CA bus.

The command interface 14 may receive one or more clock signals from an external device. Generally, double data rate (DDR) memory utilizes a clock signal, which may be provided as a differential pair formed by the true clock signal (Clk_t) and the complementary clock signal (Clk_c). Commands (e.g., read command, write command, etc.) are typically entered on the positive edges of the clock signal (e.g., the positive edge of the true clock signal). A clock input circuit within the command interface 14 receives the true clock signal (Clk_t) and the complementary clock signal (Clk_c), and generates an internal clock signal CLK. The internal clock signal CLK may be supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data. The internal clock signal CLK may also be provided to various other components within the memory device 10 and may be used to generate various additional internal clock signals. For instance, the internal clock signal CLK may be provided to a command decoder 32.

The command decoder 32 may receive command signals from the command bus 34 and may decode the command signals to provide various internal commands to perform operations in the memory. Further, the command decoder 32 may decode commands, such as read commands, write commands, mode-register set commands, activate commands, etc., and provide access to a particular memory bank 12 corresponding to the command, via the bus 40. As will be appreciated, the memory device 10 may include various other decoders, such as row decoders and column decoders, to facilitate access to the memory banks 12.

The memory device 10 executes operations, including read commands and write commands, based on the command/address signals received from an external device, such as a processor. In one embodiment, the command/address (CA) bus may be a 14-bit bus to accommodate the command/address signals (CA<13:0>). The command/address signals are clocked to the command interface 14 using the clock (Clk_t and Clk_c), as discussed above. Access to specific memory banks 12 within the memory device 10 is encoded on the CA<13:0> bus with the commands. As an example, a processor requesting data from memory device 10 may provide a CS enable signal via an input pin to inform the memory device 10 that it should operate on the CA signal available in the bus. To this end, the command interface 14 and/or the command decoder 32 may receive the CA signal to identify the command and the target memory banks 12 associated with the address in the CA signal. The command decoder 32 may, via the bus 40, request the bank control circuitry 22 associated with the target memory bank 12 to activate a data row or data column associated with the requested address in the CA signal.

Based on the command received via bus 40, the bank control block may cause the memory banks 12 to provide the requested data via data path 46 and I/O interface 16 or to store in the memory banks data available in the data path 46, received via I/O interface 16. In some embodiments, the command decoder 32 may also generate timing strobe signals (e.g., read strobe and write strobes) that may be provided via the bus 40, and may be used to synchronize the access to memory banks 12 and to the data path 46 during read and write operations. In some embodiments, the memory banks 12 may include a bank control circuitry 22 responsible for providing address decoding and/or generating timing strobe signals (e.g., read strobe and write strobes) to facilitate the execution of commands to and from the memory banks 12.

In addition, the command interface 14 may be configured to receive a number of other command signals. For instance, a command/address on die termination (CA_ODT) signal may be provided to facilitate proper impedance matching within the memory device 10. A reset command (RESET) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT) to the system processor or controller for certain errors that may be detected. For instance, an alert signal (ALERT) may be transmitted from the memory device 10 if a cyclic redundancy check (CRC) error is detected. Other alert signals may also be generated. Further, the bus and pin for transmitting the alert signal (ALERT) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data path 46, which includes a plurality of bi-directional, half-width data buses. Data I/O signals, generally referred to as DQ signals, are generally transmitted and received in one or more bi-directional data buses. To allow for higher data rates within the memory device 10, certain memory devices, such as DDR memory devices, may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t/and DQS_c) to provide differential pair signaling during reads and writes.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
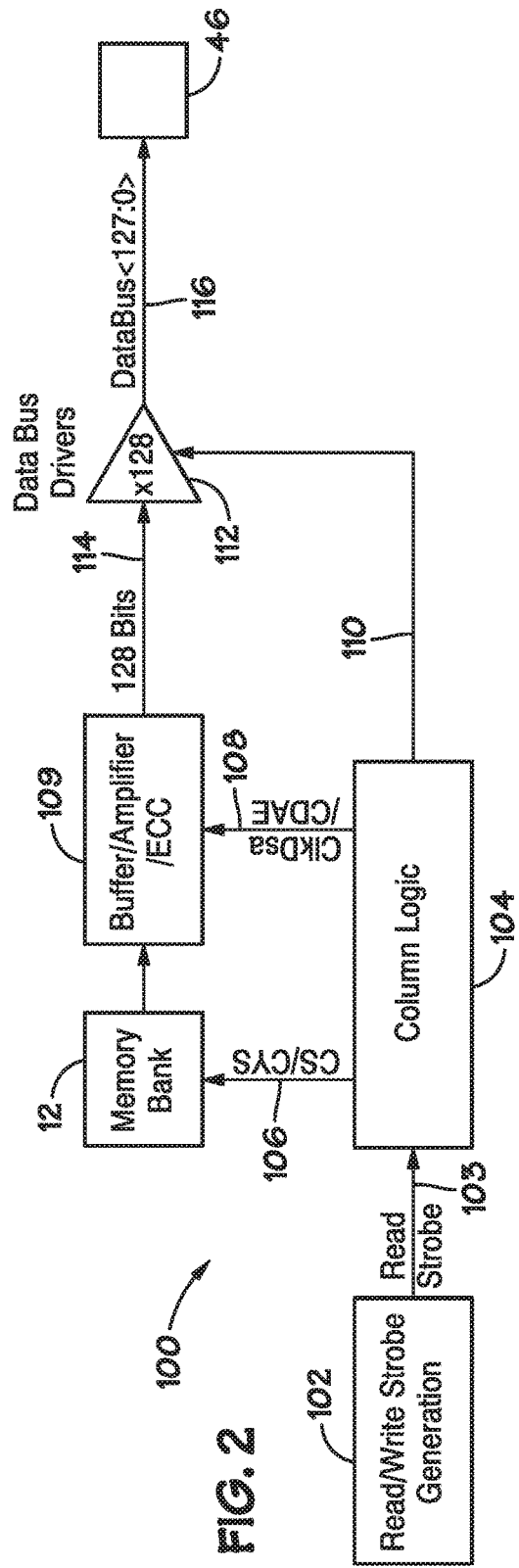
FIG. 2 is a block diagram illustrating memory bank access circuitry that may perform read operations using a full-width, single pumped data path, in accordance with an embodiment.

FIG. 2 illustrates bank access circuitry 100 that may be disposed in the bank control circuitry 22 (e.g., a control logic), and may control the access to the memory bank 12. The bank access circuitry 100 employs a single-pumped operation for a full-width data path. The bank access circuitry 100 is arranged to perform a read operation by controlling the access and transmission of data from memory bank 12 to the data path 46. The bank access circuitry 100 may include a strobe generation block 102, which may generate a read strobe pulse 103. As discussed above, the read strobe pulse 103 may be generated by the command decoder 32, illustrated in FIG. 1.

A column logic block 104 may receive the read strobe pulse 103 and generate column timing signals, such as the column strobe signal 106 and a column access signal 108. The column strobe signal 106 may be used to activate a column in the memory bank 12. Column access signal 108 may be used to activate a read stage 109, which in the illustrated example, may include read amplifier circuitry and/or error correction circuitry. It should be noted that the present column logic 104 can be used to drive other types of read stages that may perform other functionalities. As further detailed below, the column logic block 104 may introduce a delay between the column strobe signal 106 to provide timing slack that accounts for data transmission delays between memory bank 12 and read stage 109. The column logic block 104 may also generate a data timing signal 110. The data timing signal 110 may be used to control the data bus driver 112. The data bus driver 112 may receive the read data in an internal bus 114 and provide the full-width data 116 to the data path 46.

Figure 3:
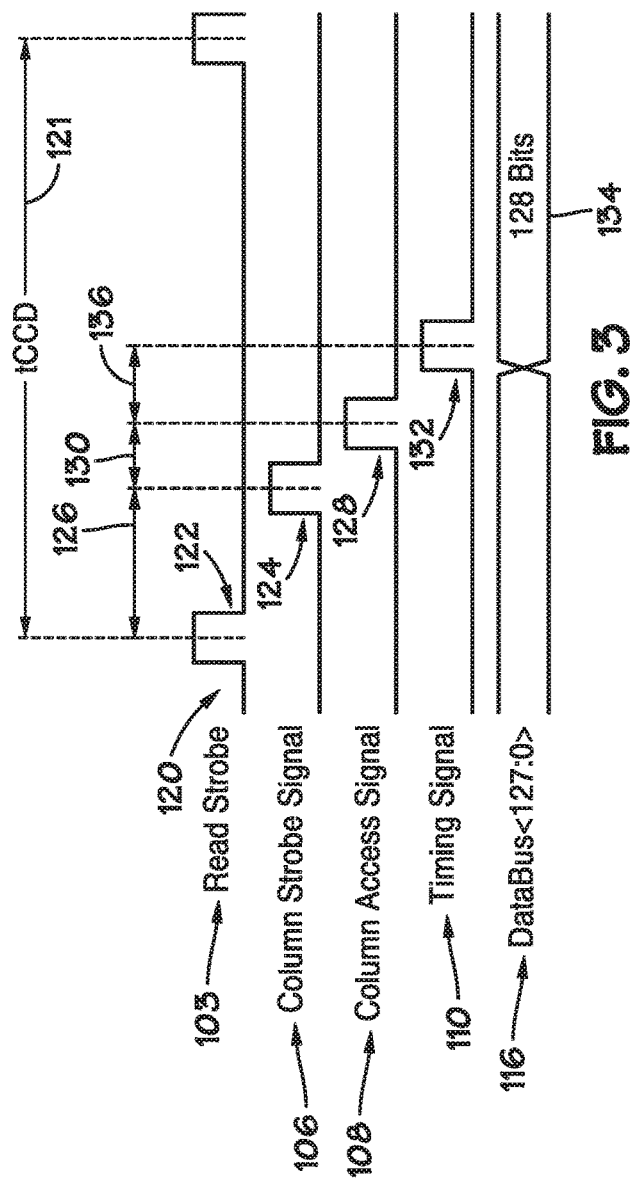
FIG. 3 is a timing diagram illustrating a read operation that may be performed by memory bank access circuitry, such as that of FIG. 2, in accordance with an embodiment.

FIG. 3 illustrates the timing chart 120 for a read operation in the bank access circuitry 100. The chart shows the relationship between the read strobe 103, column timing signals including column strobe signal 106 and column access signal 108, data timing signal 110, and the full-width data 116. As a reference, the timing diagram illustrates the column-to-column period ($t_{CCD}$) 121, which is the period between two column read-outs and may be part of the specification for the memory device. The read strobe 103 may include one activation pulse 122 per $t_{CCD}$. Based on the activation pulse 122, column logic 104 may generate an activation pulse 124 in the column strobe signal 106 following a delay 126. Column logic 104 may generate another activation pulse 128 in the column access signal 108 after a further delay 130.

The column logic 104 may also generate an activation pulse 132 on the data timing signal 110. Upon receiving the activation pulse 132, the data bus driver 112 may provide the word 134, which was read from the memory bank 12, as the full-width data 116. The column logic 104 may include a delay 136 between the last column timing signal generated (e.g., column access signal 108) and the data timing signal 110 to account for potential delays in the internal bus 114.

FIG. 4 illustrates an embodiment of bank access circuitry 150 that may employ a double-pumped operation that allows access to data from the memory bank 12 through a half-width data path 46. Bank access circuitry 150 is arranged to perform a read operation. For the double-pumped operation, the strobe generation block 102 is configured to generate a read strobe signal 153 with two activating pulses per read cycle, as discussed with respect to FIG. 5. The column logic box 154 of the bank access circuitry 150 may be configured to receive the read strobe signal 153 with two activating pulses. For column timing signals, such as column strobe signal (CS/CYS) 156 and column access signal (ClkDsa/CDAE) 158, the column logic box 154 may generate a single pulse based on the read strobe signal 153. Column strobe signal 156 may drive the memory bank 12, while column access signal 158 may drive the read stage 109.

The column logic box 154 may also generate two data timing signals 160A and 160B, which may be provided in a two-bit bus (DBUSEn<1:0>) 161. Timing signals 160A and 160B may be used to control data bus drivers 162A and 162B, respectively. Data bus drivers 162A and 162B are both half-width drivers, and may be used to provide half-width data to a half-width data bus 166. Data bus drivers 162A and 162B may each receive half of the word (half-width data) from a full-width internal bus 168. As detailed below, the data timing signals 160A and 160B may be such that only one of the two data bus drivers 162A and 162B is activated at a particular moment, preventing collisions in the half-width data bus 166. The bank access circuitry 150 may also include a burst order multiplexer 169. Burst order multiplexer 169 may be used to invert the order of the byte to a customer requested format (e.g., from big endian to little endian), and may provide the two-fold split in the half-width internal bus 168. It should be noted that the burst order multiplexer 169 may be configured to provide (or to include such a circuit that may provide) two half-width data in sequence based on the timing signals 160A and 160B. In such case, the internal bus 168 should become a half-width and only one set of data bus drivers (162A or 162B) is provided.

As discussed above, the bank access circuitry 150 that implements double-pumped half-width operation allows substantial reutilization of components from a full-width circuitry, such as bank access circuitry 100 of FIG. 2. In fact, the memory bank 12 and the interface and reading logic, such as read stage block 109, may be reused without need for duplication. Moreover, burst order multiplexer 169 may also be present in memory devices with full-width data paths, in order to provide customizable formats. Thus, the conversion from a full-width circuitry to a half-width circuitry may achieve substantial reduction in the amount of metal in the data path 46, without substantial duplication of logic in the memory device 10.

FIG. 5 illustrates the timing chart 170 for a read operation in the bank access circuitry 150. The chart shows the relationship between the read strobe 153, column timing signals including column strobe signal (CS/CYS) 156 and column access signal (ClkDsa/CDAE) 158, data timing signals (DBUSEn<0> and DBUSEn<1>) 160A and 160B, and the half-width data 166. As a reference, the timing diagram illustrates the column-to-column period ($t_{CCD}$) 121, which is the period between two column read-outs and may be part of the specification for the memory device. The read strobe signal 153 may include two activation pulses 172 and 188, which may be spaced by a half $t_{CCD}$ period 171. Based on the first activation pulse 172, column logic 154 may generate an activation pulse 174 in the column strobe signal 156 following a delay 176. Column logic 154 may generate another activation pulse 178 in the column access signal 158 after a further delay 180.

The column logic 154 may generate an activation pulse 182 on the first data timing signal 160A. The activation pulse 182 may be based on the first activation pulse 172 of the read strobe 153. The column logic 154 may introduce a total delay 186 between the first activation pulse 172 and the activation pulse 182 on the first data timing signal 160A. Upon receiving this activation pulse 182, the first data bus driver 162A may provide the first half of the word 184 as the half-width data 166. The column logic 154 may also generate an activation pulse 190 on the second data timing signal 160B. The activation pulse 190 may be based on the second activation pulse 188 of the read strobe 153. The column logic 154 may introduce the same total delay 186 between the second activation pulse 188 and the activation pulse 190 on the second data timing signal 160B. Upon receiving this activation pulse 190, the second data bus driver 162B may provide the second half of the word 192 as the half-width data 166. As discussed above, data timing signals 160A and 160B are coordinated such that the first half of the word 184 and the second half of the word 192 do not collide in the data bus 166 of the data path 46.

Figure 6:
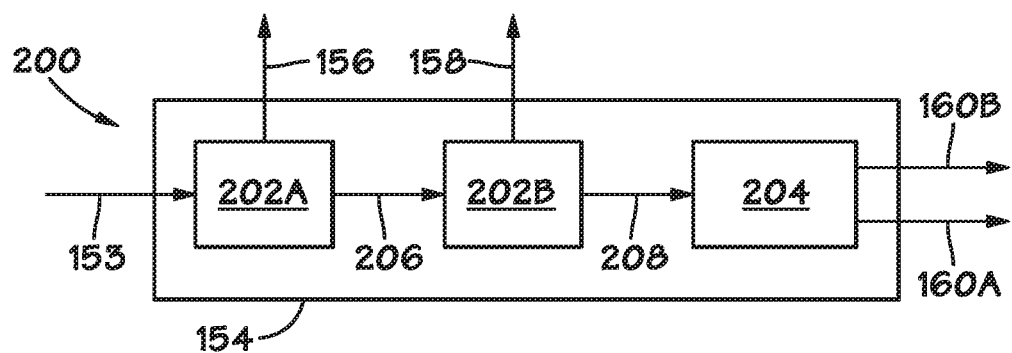
FIG. 6 is a block diagram illustrating column access logic that may be used in combination with memory bank access circuitry of FIG. 4, in accordance with an embodiment.

The block diagram 200 in FIG. 6 illustrates an embodiment for column logic 154. The illustrated column logic 154 includes a chain of delay blocks 202A, 202B, and 204. The first delay block 202A may receive the data strobe signal 153, and may produce the column strobe signal 156. The delay block 202A may also provide a delayed data strobe signal 206 to the second delay block 202B. The second delay block 202B may provide a column access signal 158, as well as a delayed data strobe signal 208 to the third delay block 204. Delay block 204 may provide the data timing signals 106A and 160B. In this example, column logic may have delay blocks 202A and 202B that include a single pulse generator and delay block 204 that includes a dual pulse generator. As detailed below, a single pulse generator produces a single activating pulse based on a dual pumped strobe signal 153 while a dual pulse generator generates two activating pulses that are offset by a half-period based on a dual pumped strobe signal 153.

Figure 7:
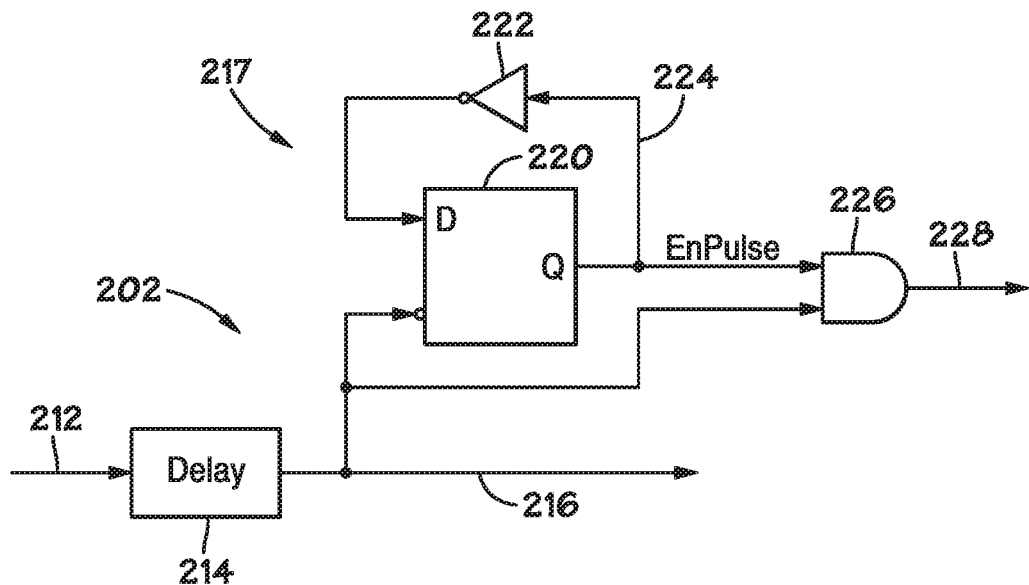
FIG. 7 is a block diagram illustrating a single pulse generator block that may be used in column access logic, such as that of FIG. 6, in accordance with an embodiment.
Figure 8:
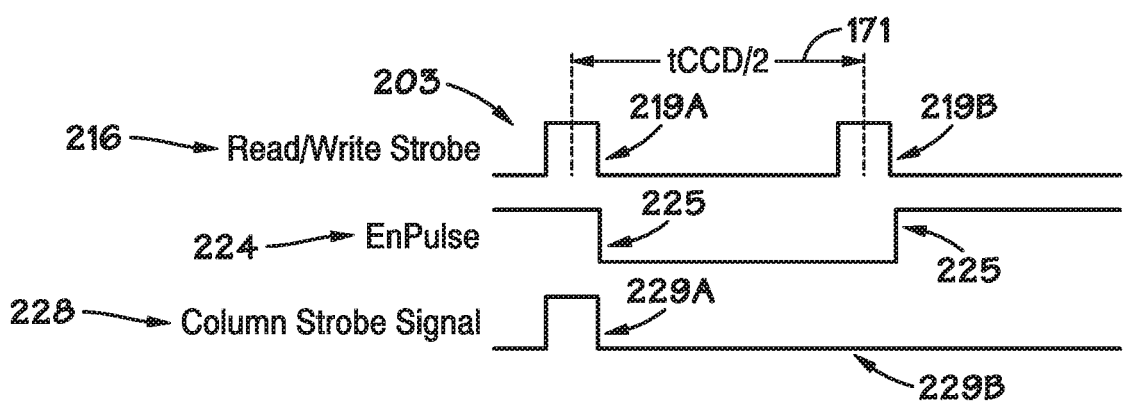
FIG. 8 is a timing diagram illustrating the pulse generation of the single pulse generator block of FIG. 7, in accordance with an embodiment.

A delay block 202 with a single pulse generator is illustrated in FIG. 7. The delay block 202 may receive a strobe signal 212 and, using a delay element 214, may produce a delayed strobe signal 216. The delayed strobe signal 216 may be provided to the next delay block of the chain, as illustrated in FIG. 6. The delayed strobe signal 216 may also be provided to the single pulse generator 217. Description of the operation of the single pulse generator 217 is provided using the timing diagram 203 of FIG. 8. The single pulse generator 217 may have a latch 220 that receives the delayed strobe signal 216. The latch 220 may also be coupled to an inverter 222 in a feedback loop. The arrangement may output an enable pulse signal 224 that toggles between two states (e.g., toggles between logic high and logic low) as the latch 220 receives a triggering edge (e.g., a logic high to logic low edge) from the delayed strobe signal 216. As exemplified in the timing diagram 203, the enable pulse signal 224 toggles (e.g., edges 225) when the delayed strobe signal 216 presents a triggering edge (e.g., edges of pulses 219A and 219B). Logic element 226 may gate the delayed strobe signal 216 based on the enable pulse signal 224, resulting in an output signal 228 that skips one pulse of every two pulses in delayed strobe signal 216. In fact, the output signal 228 includes an activating pulse 229A based on the first pulse 219A but does not have an activating pulse in region 229B in the region of the second pulse 219B.

A delay block 204 with a dual pulse generator is illustrated in FIG. 9. The delay block 204 may receive a strobe signal 232 and, using the delay element 214, may produce a delayed strobe signal 234. The delayed strobe signal 234 may be provided to the dual pulse generator 237. Description of the operation of the dual pulse generator 237 is provided using the timing diagram 205 of FIG. 10. The dual pulse generator 237 may include a latch 240 that receives the delayed strobe signal 234. The latch 240 is also coupled to an inverter 242 in a feedback loop. The arrangement may output a first enable signal 244 that toggles between two states (e.g., toggles between logic high and logic low) as the latch 240 receives a triggering edge from the delayed strobe signal 234. The arrangement may also output a second enable signal 246, which is complementary to the first enable signal 244. As exemplified in the timing diagram 205, the first enable signal 244 and the second enable signal 246 toggle when the delay strobe signal 234 presents a triggering edge. Moreover, it should be noted that the first enable signal 244 and the second enable signal 246 are always complementary. Logic element 248 may gate the delayed strobe signal 234 based on the first enable signal 244, whereas logic element 250 gates the delayed strobe signal 234 based on the second enable signal 246. As a result, the dual pulse generator 237 may provide a first output 252A that provides a pulse 253A corresponding to the first activating pulse 235A of the delayed strobe signal 234, and a second output 252B that provides a pulse 253B corresponding to the second activating pulse 235B of the delayed strobe signal 234.

FIG. 11 illustrates an embodiment of bank access circuitry 350 that may employ a double-pumped operation that allows storage of data in the memory bank 12 through a half-width data bus 366 of the data path 46. Bank access circuitry 350 is arranged to perform a write operation. For the double-pumped operation, the strobe generation block 102 is configured to generate a write strobe signal 353 with two activating pulses per write cycle, as detailed below in the discussion of FIG. 12. The write strobe signal 353 may be substantially similar to the read strobe signal 153 of FIG. 4. The column logic 354 of the bank access circuitry 350 may be configured to receive the write strobe signal 353 with two activating pulses. For column timing signals, such as column strobe signal 356 and column access signal 358, the column logic 354 may generate a single pulse based on the write strobe signal 353. Column strobe signal 356 may drive the memory bank 12, while column access signal 358 may drive the write stage block 359.

The column logic 354 may also generate two data timing signals 360A and 360B, which may be provided in a two-bit bus 361. Data timing signals 360A and 360B may be used to control input buffers 362A and 362B, respectively. Input buffers 362A and 362B are both half-width buffers, and may be used to store received half-width data 366 of the half-width data path 46. Input buffers 362A and 362B may each provide the received half-width data 366 to the full-width internal bus 368. As detailed below, the data timing signals 360A and 360B may be such that only one of the two input buffers 362A and 362B latches the half-width data 366 at a time. The bank access circuitry 350 may also include a burst order multiplexer 352. The burst order multiplexer 352 may be used to invert the order of the byte in response to a customer requested format (e.g., from big endian to little endian), and may perform concatenation of the half-words in the full-width internal bus 368. As with the bank access circuitry 150 above, the bank access circuitry 350 that implements double-pumped half-width operation allows substantial reutilization of components from a full-width circuitry. In fact, the memory bank 12 and the interface and the write logic, such as write stage block 359, may be reused from write circuitry programmed for use with full-width data path, without need for duplication. Thus, the conversion from a full-width circuitry to a half-width circuitry may achieve substantial reduction in the amount of metal in the data path 46, without substantial duplication of logic in the memory device 10. It should be noted that the burst order multiplexer 352 may be configured to receive (or to include such a circuit that may receive) two half-width data in sequence based on the timing signals 360A and 360B. In such case, the internal bus 368 should be a half-width bus and a single set of input buffers (362A or 362B) can be used.

FIG. 12 illustrates the timing chart 370 for a write operation in the bank access circuitry 350. The chart shows the relationship between the write strobe signal 353, column timing signals including column strobe signal 356 and column access signal 358, data timing signals 360A and 360B, and the half-width data 366. As a reference, the timing diagram illustrates the column-to-column period ($t_{CCD}$) 121, which is the period between two column write operations, and may be part of the specification for the memory device. The write strobe signal 353 may include two activation pulses 362 and 372, which may be spaced by a half $t_{CCD}$ period. Based on the first activation pulse 362, column logic 354 may generate an activation pulse 364 in the first data timing signal 360A. The activation pulse 364 may cause the input buffer 362A to latch the first word 384 from the half-width data 366. Based on the second activation pulse 372, the column logic 354 may generate an activation pulse 374 in the second data timing signal 360B. The activation pulse 374 may cause the input buffer 362B to latch the second word 392 from the half-width data 366. Following the second activation pulse 372, the full-width internal bus 368 may have the full word for writing in memory bank 12.

The column logic 354 may, based on the second activation pulse 372, generate an activation pulse 374 in the column access signal 378, following a delay. After a further delay, the column logic 354 may generate an activation pulse 380 in the column strobe signal 356. During the write operation, the column logic 354 may employ the second activation pulse of the write strobe signal 353, in contrast with the use of the first activation pulse of the read strobe 153, in the system above described. The design difference may be made to account for the distinctions between read and write operations. It should also be noted that, due to the direction of the data during write operations, the data timing signal 360B may be active before the column activating signals such as column access signal 358 and column strobe signal 356.

Figure 13:
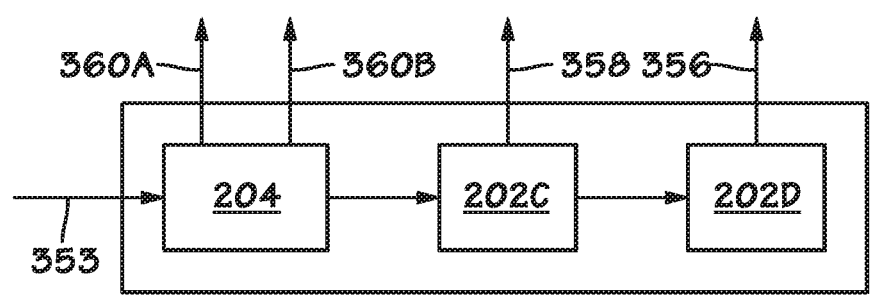
FIG. 13 is a block diagram illustrating column access logic that may be used in combination with memory bank access circuitry, such as that of FIG. 12, in accordance with an embodiment.

Block diagram 380 in FIG. 13 illustrates an embodiment for column logic 354 that enforces the above-described order of activation. The illustrated column logic 354 includes a chain of delay blocks 204, 202C, and 202D. The first delay block 204 may receive the write strobe signal 353, and may produce the data timing signals 360A and 360B. The delay block 204 may also provide a delayed data strobe signal to the second delay block 202C in the chain. The second delay block 202C may provide column access signal 358, as well as a delayed data strobe signal to the third delay block 202D. The third delay block 202D may provide the column strobe signal 356. In this example, column logic 354 may have delay blocks 202C and 202D that include a single pulse generator, and a delay block 204 that includes a dual pulse generator. Delay blocks 202C and 202D may be similar to the delay block 202 of FIG. 7, and delay block 204 may be similar to the delay block 204 of FIG. 9.

Flow charts 400 of FIG. 14 and 420 of FIG. 15 describe methods of operation of circuitry discussed that present the advantages discussed herein. Flow chart 400 describes methods for circuitry performing read operations using a double-pumped half-width data path. Flow chart 400 may include a process 402 to read data (e.g., a full-width word) from the memory array 12 using a bank activation signal based on a first pump (e.g., the first activation pulse of a double pumped strobe signal). In process 404, verification and processing circuitry may process the full-width word, as clocked by a delayed single pump. Verification and processing circuitry may be error correction code (ECC) circuitry, amplification circuitry, order rearrangement circuitry, data inversions circuitry, etc. In a process 406, the full-width word may be split using splitting circuitry. The splitting circuitry may produce divided words, which may be multiplexed using the double pumped strobe signal. To that end, circuitry may split the full-width internal bus and provide a respective half of the full-width word to separate drivers. In a process 408, the drivers may write to the half-width data path.

Flow chart 420 describes methods for circuitry performing write operations using a double-pumped half-width data path. Flow chart 420 may include a process 422 to retrieve data to be stored in the memory array 12 from a half-width data path, as discussed above. Input circuitry may, in process 422, employ a double-pumped strobe signal to receive and store (e.g., latch) two half-width words to recover the full-width word. Concatenating circuitry may concatenate the words in process 424. In process 426, verification and processing circuitry may process the full-width word, as clocked by a delayed single pump. Verification and processing circuitry may be error correction code (ECC) circuitry, buffer circuitry, timing, and amplification circuitry, order rearrangement circuitry, data inversion circuitry, etc. The delayed single pump may be the second activation signal for the double-pumped strobe signal. Based on a further delayed single pump, the memory array 12 may store the full-width word upon receiving a bank activation signal, in process 428, following operations by the verification and processing circuitry.

Embodiments described herein may be used to allow memory devices to employ half-width bus lines and/or data paths between memory banks and I/O interfaces of the memory device. To that end, the embodiments described herein may include interface circuitry (e.g., data bus drivers and input buffers), disposed in the bank control circuitry, and that may operate using short words with data widths that may be smaller than the data width of memory cells of the memory device. The data width of the short words may be determined based on the data path width. For example, the data path may have half, a fourth, or an eight of the data width of the word width in the memory device. While the embodiments discussed above focus on systems in which the data path is half-bandwidth, systems that employ smaller data paths may be obtained by adjusting the bank logic to operate with strobe signals having multiple activation pulses.

The methods and systems described herein for operation of memory devices allow reduction of data paths without substantial impact on the size of the memory device and/or memory device components, as it does not rely on duplication or replication of circuitry or creation of an additional delay chain (e.g., a CAS chain). Moreover, the methods and systems may be obtained with substantial reutilization of circuitry that is compatible with full-width data paths. As such, the reduction of metallization from the reduction of the width of the data path may take place without substantial design overhead in the bus control circuitry. The methods discussed herein may be used to improve operations of dynamic random access memory (DRAM) devices, synchronous DRAM (SDRAM) devices, double data rate (DDR) memory devices, flash memory devices, static random access (SRAM) devices, or any other memory device that may employ an internal bus.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. A memory device, comprising:
a memory bank comprising memory cells, wherein each of the memory cells comprises a respective stored word having a first data width;
a data path comprising a data bus, wherein the data bus has a second data width that is smaller than the first data width;
splitting circuitry configured to split a stored word into a plurality of short words, each short word having the second data width;
a first data bus driver configured to receive a first short word of the plurality of short words; and
a second data bus driver configured to receive a second short word of the plurality of short words.

2. The memory device of claim 1, comprising:
a first input buffer configured to receive a third short word of a second plurality of short words;
a second input buffer configured to receive a fourth short word of the second plurality of short words; and
concatenating circuitry configured to merge the second plurality of short words into a received word to be stored in the memory bank; and
control logic configured to:
  receive a strobe signal comprising a first pulse and a second pulse in a period;
  cause the first input buffer to latch the third short word from the data path based on the first pulse;
  cause the second input buffer to latch the fourth short word from the data path based on the second pulse; and
  cause the memory bank to store the received word based on the second pulse.

3. The memory device of claim 2, wherein the concatenating circuitry comprises reordering circuitry.

4. The memory device of claim 2, comprising a write stage block configured to receive the received word from the concatenating circuitry, and wherein the control logic is configured to cause the write stage block to operate based on the second pulse.

5. The memory device of claim 4, wherein the write stage block comprises error correction code (ECC) circuitry.

6. The memory device of claim 2, wherein the control logic is configured to cause the memory bank to provide the stored word to the splitting circuitry based on the first pulse.

7. The memory device of claim 1, wherein the splitting circuitry comprises a multiplex reordering circuitry.

8. The memory device of claim 2, comprising a read stage block configured to receive the stored word from the memory bank, and wherein the control logic is configured to cause the read stage block to operate based on the first pulse.

9. The memory device of claim 1, wherein the first data width comprises 128 bits, the second data width comprises 64 bits, and the plurality of short words comprises two short words.

10. The memory device of claim 2, comprising a third data bus driver configured to receive a fifth short word of the plurality of short words, a fourth data bus driver configured to receive a sixth short word of the plurality of short words, wherein the strobe signal comprises a third pulse and a fourth pulse, and wherein the control logic is configured to cause the third data bus driver to write the fifth short word to the data bus based on the third pulse and to cause the fourth data bus driver to write the sixth short word to the data bus based on the fourth pulse.

11. The memory device of claim 1, wherein the memory device comprises a double data rate (DDR) memory device, a flash memory device, a static random access (SRAM) device, or any combination thereof.

12. A method of operation for a delay element of a memory device comprising:
receiving a strobe signal comprising a first pulse and a second pulse;
providing, to first interface circuitry coupled to a first data path, a first activation signal based on the first pulse, wherein the first data path and the first interface circuitry comprise a first data width;
providing, to a second interface circuitry coupled to the first data path, a second activation signal based on the second pulse;
providing, to a memory bank, a bank activation signal based on the first pulse;
splitting the first data path to a second data path and a third data path, wherein the second and data path is a second data width and the third data path is a third width, and wherein the second and third data widths are half of the first data width; and
providing, to the memory bank, the bank activation signal based on the second pulse from the second interface circuitry, wherein the second interface circuitry is coupled to the second or third data path.

13. The method of claim 12, comprising:
receiving, by the memory device, a read operation request; and
delaying the first pulse after providing the bank activation signal and before providing the first activation signal.

14. The method of claim 12, comprising:
receiving, by the memory device, a write operation request; and
delaying the first pulse after providing the first activation signal and before providing the bank activation signal.

15. A memory device, comprising:
a first data bus configured to have a first data width;
a memory array coupled to the first data bus;
a second data bus configured to have a second data width that is smaller than the first data width;
control logic configured to:
receive a strobe signal comprising a first pulse and a second pulse;
provide a first timing signal in response to the first pulse; and
provide a second timing signal in response to second pulse.

16. The memory device of claim 15, comprising:
receiving, by the memory device, a read operation request; and
delaying the first pulse after providing the first timing signal and before providing the second timing signal.

17. The memory device of claim 15, wherein the control logic is configured to split the first data width in a third data width and a fourth data width, and wherein the third data width and the fourth data width or half of the first data width.

* * * * *